(12) United States Patent
Siroisi et al.

(10) Patent No.: US 11,156,520 B2
(45) Date of Patent: Oct. 26, 2021

(54) PHYSICAL QUANTITY SENSOR HAVING A WALL INCLUDING FIRST AND SECOND PROTRUSION ARRANGEMENTS

(71) Applicant: PANASONIC INTELLECTUAL PROPERTY MANAGEMENT CO., LTD., Osaka (JP)

(72) Inventors: Hisanori Siroisi, Mie (JP); Jun Ogihara, Mie (JP); Naoki Ushiyama, Mie (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 103 days.

(21) Appl. No.: 16/671,738

(22) Filed: Nov. 1, 2019

(65) Prior Publication Data

US 2020/0064214 A1     Feb. 27, 2020

Related U.S. Application Data

(63) Continuation of application No. PCT/JP2018/015931, filed on Apr. 18, 2018.

(30) Foreign Application Priority Data

Jun. 21, 2017    (JP) .............................. JP2017-121487

(51) Int. Cl.
    *G01L 9/00*            (2006.01)
(52) U.S. Cl.
    CPC .......... *G01L 9/0073* (2013.01); *G01L 9/0042* (2013.01)

(58) Field of Classification Search
None
See application file for complete search history.

(56) References Cited

U.S. PATENT DOCUMENTS

| 2008/0200009 A1* | 8/2008 | Lim .................... H01L 21/2007 |
| | | 438/455 |
| 2016/0033347 A1* | 2/2016 | Hayashi ................ G01L 9/0042 |
| | | 73/723 |
| 2016/0195446 A1 | 7/2016 | Kataoka et al. |

FOREIGN PATENT DOCUMENTS

WO     2015/025496     2/2015

* cited by examiner

*Primary Examiner* — Andre J Allen
*Assistant Examiner* — Jermaine L Jenkins
(74) *Attorney, Agent, or Firm* — Greenblum & Bernstein, P.L.C.

(57) ABSTRACT

A physical quantity sensor includes a first substrate, an electrode provided on the first substrate, a diaphragm made of semiconductor material, a second substrate fixed to the first substrate, a dielectric film provided on the diaphragm, and a wall provided between the dielectric film and the electrode. The second substrate supports the diaphragm such that the diaphragm has an opposing surface facing the electrode across a space. The dielectric film is provided on the opposing surface of the diaphragm. The dielectric film has a surface facing the electrode across the space. The wall includes a first protrusion and a second protrusion. The first protrusion protrudes toward the electrode from the surface of the dielectric film. The second protrusion protrudes toward the electrode from the first protrusion, and contacts the electrode. The second protrusion is made of material which is different from material of the dielectric film.

10 Claims, 3 Drawing Sheets

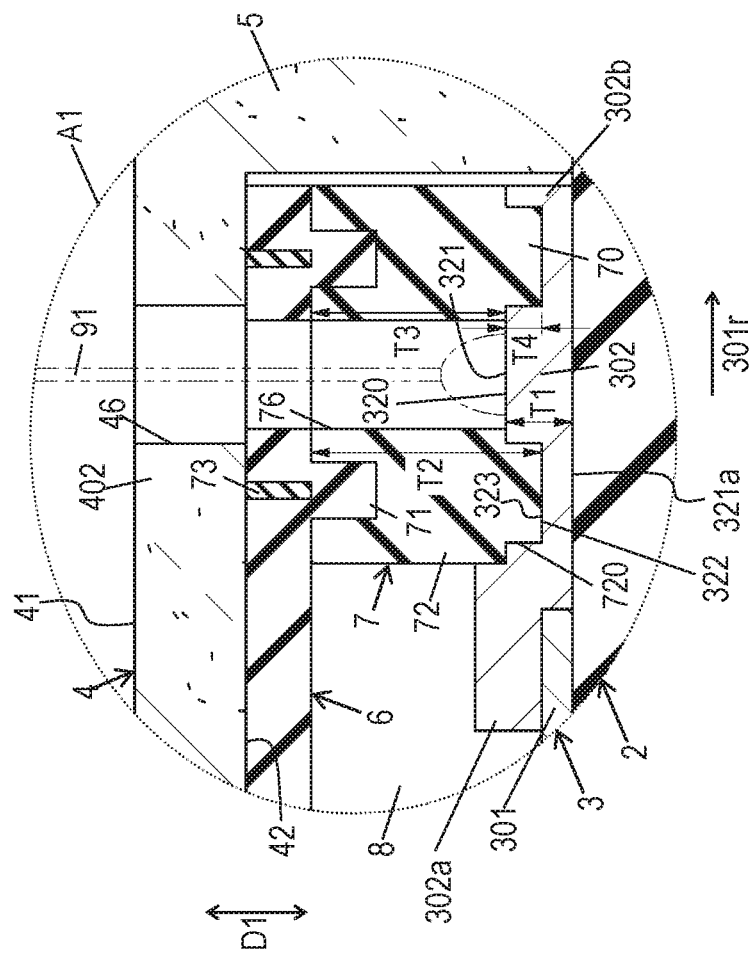

PHYSICAL QUANTITY SENSOR HAVING A WALL INCLUDING FIRST AND SECOND PROTRUSION ARRANGEMENTS

This application is a continuation of the PCT international application No. PCT/JP2018/015931 filed on Apr. 18, 2018, which claims the benefit of foreign priority of Japanese patent application No. 2017-121487 filed on Jun. 21, 2017, the contents all of which are incorporated herein by reference.

TECHNICAL FIELD

The present invention relates to a physical quantity sensor including a diaphragm that warps in accordance with physical quantity serving as an object to be measured.

BACKGROUND ART

As a conventional physical quantity sensor, a semiconductor physical quantity sensor including a glass substrate, an electrode on an upper surface of the glass substrate, a semiconductor substrate bonded and fixed to the glass substrate, and an electrode on an upper surface of the semiconductor substrate (see International publication No. 2015/025496).

In the semiconductor physical quantity sensor described in International publication No. 2015/025496, a cavity is formed in a lower surface of the semiconductor substrate. The cavity formed in the semiconductor substrate form a thin plate portion having a thickness locally thinned. The thin plate portion functions as a diaphragm that warps in accordance with physical quantity applied from the outside. The diaphragm faces the electrode on the upper surface of the glass substrate across a space. Further, a silicon oxide film which serves as an insulating film is formed on a surface of the diaphragm facing the glass-substrate.

In the semiconductor physical quantity sensor described in International publication No. 2015/025496, the wall demarcating the space is formed between the silicon oxide film and the electrode formed on the upper surface of the glass substrate.

SUMMARY

A physical quantity sensor is configured to detect physical quantity. The physical quantity sensor includes a first substrate, an electrode provided on the first substrate, a diaphragm made of semiconductor material, a second substrate fixed to the first substrate, a dielectric film provided on the diaphragm, and a wall provided between the dielectric film and the electrode. The diaphragm warps in accordance with the physical quantity. The second substrate supports the diaphragm such that the diaphragm has an opposing surface facing the electrode across a space. The dielectric film is provided on the opposing surface of the diaphragm. The wall demarcates the space. The dielectric film has a surface facing the electrode across the space. The wall includes a first protrusion and a second protrusion. The first protrusion protrudes toward the electrode from the surface of the dielectric fil. The second protrusion protrudes toward the electrode from the first protrusion, and contacts the electrode. The second protrusion is made of material which is nitride and which is different from material of the dielectric film.

The physical quantity sensor has high moisture resistance.

BRIEF DESCRIPTION OF DRAWINGS

FIG. 2B is a partially enlarged view of the physical quantity sensor shown in FIG. 2A.

DETAIL DESCRIPTION OF PREFERRED EMBODIMENT

Figure 1:
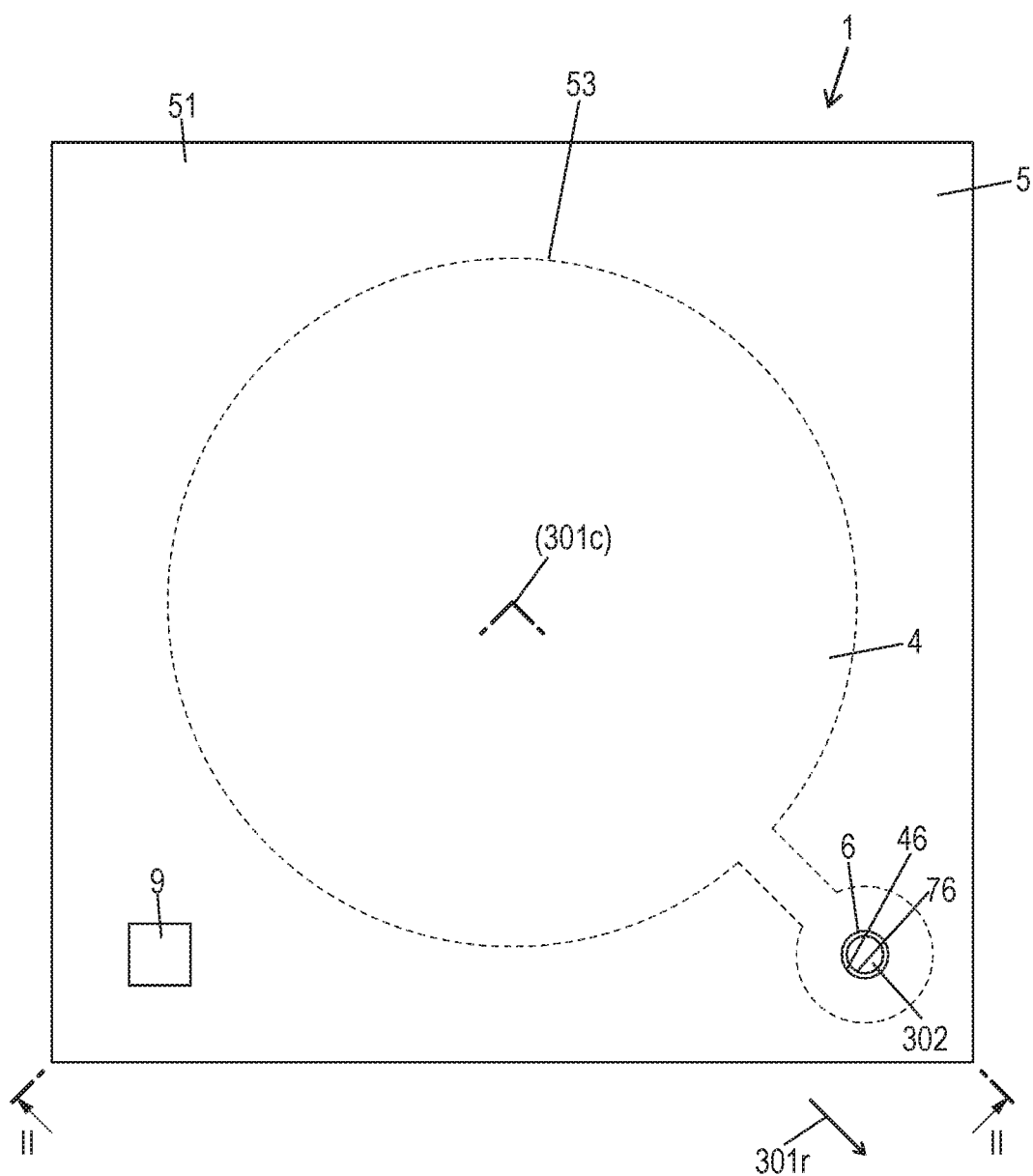
FIG. 1 is a plan view of a physical quantity sensor in accordance with an exemplary embodiment.
Figure 2A:
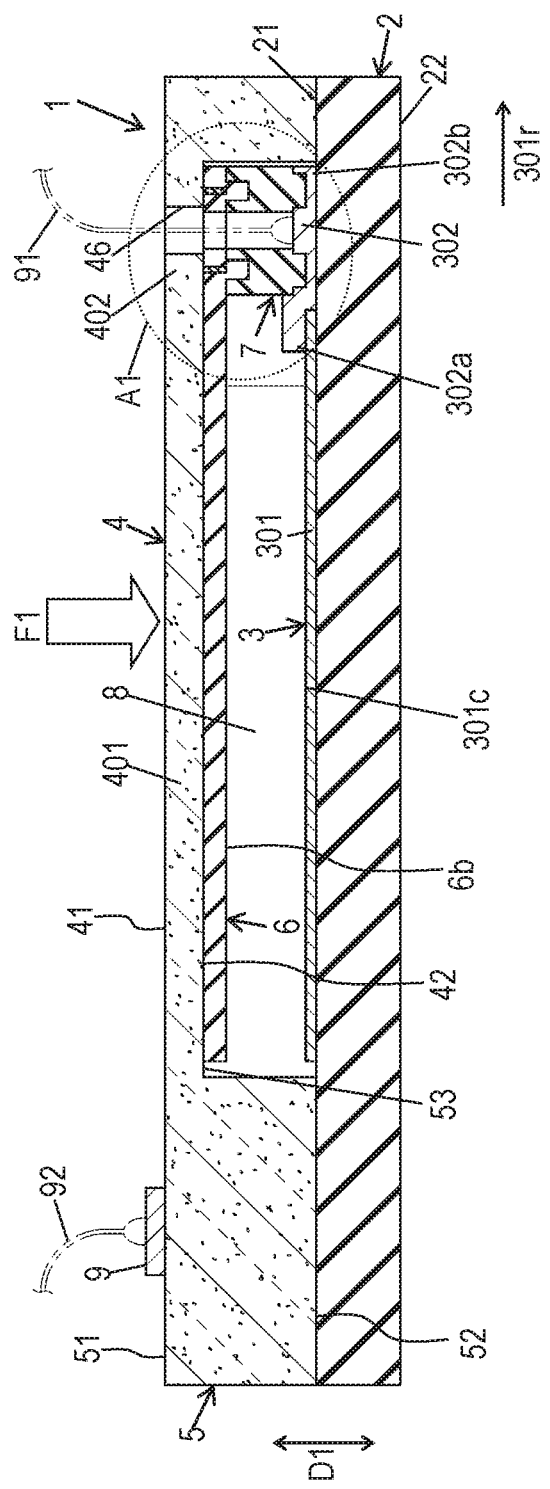
FIG. 2A is a cross-sectional view of the physical quantity sensor along line II-II shown in FIG. 1.

FIG. 1 is a plan view of physical quantity sensor 1 in accordance with an exemplary embodiment. FIG. 2A is a cross-sectional view of physical quantity sensor 1 along line II-II shown in FIG. 1. FIG. 2B is a partially enlarged view of physical quantity sensor 1 shown in FIG. 2A, and shows portion A1. FIGS. 1, 2A, and 2B are schematic views, and each ratio related to a size or thickness of each component in the figures does not necessarily reflect an actual dimension ratio.

As shown in FIGS. 2A and 2B, physical quantity sensor 1 includes substrate 2, electrode 3, diaphragm 4, substrate 5, dielectric film 6, and wall 7. Substrate 2, electrode 3, diaphragm 4, substrate 5, and dielectric film 6 are arranged in thickness direction D1. Electrode 3 is formed on substrate 2. Physical quantity sensor 1 is a capacitance type of physical quantity sensor. Diaphragm 4 of physical quantity sensor 1 is made of semiconductor material. Physical quantity sensor 1 detects physical quantity F1 applied to physical quantity sensor 1. Physical quantity F1 is, for example, a pressing force that presses diaphragm 4. Diaphragm 4 warps in accordance with physical quantity F1 (e.g., the pressing force), an object to be measured by physical quantity sensor 1. Substrate 5 supports diaphragm 4 such that diaphragm 4 faces electrode 3 across space 8. Substrate 5 is fixed to substrate 2. Diaphragm 4 has opposing surface 42 that faces electrode 3. Diaphragm 4 has surface 41 opposite to opposing surface 42. Dielectric film 6 is formed on opposing surface 42 of diaphragm 4 which faces electrode 3. Wall 7 is located between dielectric film 6 and electrode 3, and demarcates space 8.

In physical quantity sensor 1, electrode 3, dielectric film 6, and diaphragm 4 constitute a capacitor. A capacitance of the capacitor, i.e., a capacitance between diaphragm 4 and electrode 3 in changes accordance with magnitude of physical quantity F1 serving as an object to be measured.

In physical quantity sensor 1, for instance, when physical quantity F1 (pressing force) serving as the object to be measured by physical quantity sensor 1 is applied to surface 41 of diaphragm 4, diaphragm 4 warps in accordance with physical quantity F1, so that at least a distance between diaphragm 4 and electrode 3 is changed. If pressing force is applied to diaphragm 4 such that dielectric film 6 contacts electrode 3, a contact area where dielectric film 6 contacts electrode 3 increases as the pressing force increases. In physical quantity sensor 1, when the distance between diaphragm 4 and electrode 3 is changed, the capacitance between diaphragm 4 and electrode 3 changes. Further, in physical quantity sensor 1, when the contact area between dielectric film 6 and electrode 3 is changed, the capacitance between diaphragm 4 and electrode 3 changes. Accordingly, in physical quantity sensor 1, an alternating current (AC) voltage is applied between diaphragm 4 and electrode 3 from an external control device, and the control device detects a change in the capacitance between diaphragm 4 and electrode 3, for example. This configuration allows the control device to detect and measure physical quantity F1 based on the change in capacitance.

Each component of physical quantity sensor 1 will be detailed below.

A shape of physical quantity sensor 1 in plan view is, for example, a square shape (see FIG. 1). The term of "a shape of physical quantity sensor 1 in plan view" means a peripheral shape of physical quantity sensor 1 when viewed from thickness direction D1 of substrate 5. A chip size in plan view of physical quantity sensor 1 is, for example, 1.4 mm☐ (1.4 mm×1.4 mm), but not limited to this. Further, the shape of physical quantity sensor 1 in plan view is not limited to a square shape, but may be another shape, such as a rectangular shape.

As mentioned above, physical quantity sensor 1 includes substrate 2, electrode 3, diaphragm 4, substrate 5, dielectric film 6, and wall 7.

A shape of substrate 2 in plan view is a square shape similar to the shape of physical quantity sensor 1, but not limited to this. The shape of substrate 2 in plan view may be another shape, such as a rectangular shape.

Substrate 2 has front surface 21 and back surface 22 that are opposite to each other in thickness direction D1 of substrate 2. Substrate 2 has electric insulation properties. Substrate 2 is made of glass.

Electrode 3 is formed on front surface 21 of substrate 2. Electrode 3 includes capacitor electrode 301 and extraction electrode 302. A shape of capacitor electrode 301 in plan view is, for example, a circular shape. Extraction electrode 302 extends in radial direction 301r that goes away from center 301c of capacitor electrode 301, and is protruded toward radial direction 301r from capacitor electrode 301. Extraction electrode 302 has ends 302a and 302b opposite to each other in radial direction 301r of capacitor electrode 301. End 302a overlaps capacitor electrode 301. A width of extraction electrode 302 in a direction perpendicular to thickness direction D1 and radial direction 301r is shorter than a diameter of capacitor electrode 301. A shape of end 302b of extraction electrode 302 in plan view is a circular shape when viewed from thickness direction D1.

Capacitor electrode 301 is made of Cr, but not limited to this. The material may be another conductive members, such as Au.

Extraction electrode 302 is made of aluminum alloy. More specifically, the material of extraction electrode 302 is AlSi, but not limited to this. The material may be another aluminum alloy, such as AlSiCu, AlCu, AlSb, or AlTiCu. Thickness T1 (see FIG. 2B) of extraction electrode 302 formed on front surface 21 of substrate 2 is, for example, 1.3 μm. Thickness T1 is a distance between front surface 21 of substrate 2 and front surface 321 of extraction electrode 302. Recess 322 is formed in front surface 321 of extraction electrode 302, and has an annular shape when viewed from thickness direction D1. At least one part of wall 7 is located within recess 322 formed in front surface 321 of extraction electrode 302, and contacts bottom surface 323 over the entire circumference of bottom surface 323 of recess 322. This configuration allows physical quantity sensor 1 to improve airtightness of space 8. Extraction electrode 302 has back surface 321a facing front surface 21 of substrate 2, and front surface 321 opposite to back surface 321a. Front surface 321 faces in the same direction as front surface 21 of substrate 2. Length T2 (see FIG. 2B) of wall 7 protruding from dielectric film 6 is longer than shortest distance T3 (see FIG. 2B) between dielectric film 6 and front surface 321 of extraction electrode 302 by predetermined distance T4 (see FIG. 2B). Predetermined distance T4 is smaller than thickness T1 of extraction electrode 302. From a viewpoint of improving airtightness of space 8, predetermined distance T4 preferably ranges from, e.g. approximately ¼ to ¾ of the thickness of extraction electrode 302. Extraction electrode 302 is softer than wall 7, and plastically deforms when substrate 2 and substrate 5 are bonded in manufacturing physical quantity sensor 1.

In physical quantity sensor 1, diaphragm 4 faces electrode 3 across space 8. Diaphragm 4 warps in accordance with physical quantity F1 (e.g., pressing force), serving as a measurement target of physical quantity sensor 1. In other words, diaphragm 4 is deformable to warp. As mentioned above, diaphragm 4 is made of semiconductor material, and has conductivity. The semiconductor material of diaphragm 4 is, for example, Si.

Diaphragm 4 is supported by substrate 5. A thickness of diaphragm 4 in thickness direction D1 is smaller than a thickness of substrate 5 in thickness direction D1. Substrate 5 supports diaphragm 4 such that diaphragm 4 faces electrode 3 across space 8. Diaphragm 4 includes portions 401 and 402. Portion 401 of diaphragm 4 has a disk shape and faces capacitor electrode 301 of electrode 3. Portion 402 of diaphragm 4 faces extraction electrode 302 of electrode 3. Portion 401 is movable with respect to electrode 3. Portion 401 of diaphragm 4 can deform to be bent toward substrate 2. A relative position of portion 402 with respect to substrate 2 is fixed. In diaphragm 4, portions 401 and 402 are formed integrally.

A shape of substrate 5 in plan view when viewed from thickness direction D1 is a square shape (see FIG. 1) similarly to the peripheral shape of physical quantity sensor 1, but not limited to this. The shape may be a rectangular shape. Substrate 5 has front surface 51 and back surface 52 opposite to each other in thickness direction D1 of substrate 5. Substrate 5 has conductivity. Substrate 5 is made of semiconductor material. More specifically, the semiconductor material of substrate 5 is, for example, Si. In physical quantity sensor 1, diaphragm 4 is integrally formed with substrate 5. Diaphragm 4 and substrate 5 can be formed by processing a semiconductor substrate (silicon substrate). Accordingly, diaphragm 4 and substrate 5 have the same potential. In physical quantity sensor 1, external connection electrode 9 which is electrically connected to diaphragm 4 is formed on front surface 51 of substrate 5. External connection electrode 9 functions as a pad electrode to which conductive members, such as conductive wire 92, are connected. External connection electrode 9 is made of, for example, AlSi or Au. External connection electrode 9 contacts substrate to provide an ohmic contact with substrate 5.

The thickness of substrate 5 in thickness direction D1 is larger than the total thickness of the thickness of diaphragm 4 in thickness direction D1 and the thickness of dielectric film 6 in thickness direction D1. For instance, in a method of manufacturing physical quantity sensor 1, substrate 5 and diaphragm 4 can be formed by forming recess 53 in one surface of the silicon substrate in thickness direction D1 while recess 53 is an origin of substrate 5 and diaphragm 4. Recess 53 has an opening with a shape corresponding to the shape of diaphragm 4 when viewed from substrate 2. For instance, in the method of manufacturing physical quantity sensor 1, a semiconductor substrate can partially be etched by an inductively coupled plasma etching apparatus to form recess 53. Surface 41 of diaphragm 4 opposite to opposing surface 42 which faces electrode 3 is flush with front surface 51 of substrate 5.

In physical quantity sensor 1, substrate 5 is fixed to substrate 2 such that diaphragm 4 faces electrode 3 across space 8. In physical quantity sensor 1, front surface 21 of substrate 2 contacts back surface 52 of substrate 5. In physical quantity sensor 1, the glass which forms substrate 2 contains alkali component, and substrate 5 is directly bonded to substrate 2. Herein, "directly bonded" means that the bonding is performed without bonding material. In physical quantity sensor 1, the glass which forms substrate 2 contains alkali component. Thus, substrate 5 can be bonded directly to substrate 2 by anodic bonding at the time of manufacturing physical quantity sensor 1, thereby reducing a manufacturing cost. The alkali component may be, e.g. Na, K, Na$_2$O, or K$_2$O. Borosilicate glass can be employed as the glass that forms substrate 2. The borosilicate glass contains the alkali component. From a viewpoint of reducing a stress that occurs between substrate 5 and diaphragm 4, a difference between linear expansion coefficients of substrate 5 and substrate 2 is preferably small in physical quantity sensor 1. The stress is caused by the difference between linear expansion coefficients of substrate 5 and substrate 2.

In physical quantity sensor 1, dielectric film 6 is formed on opposing surface 42 of diaphragm 4 that faces electrode 3. In physical quantity sensor 1, dielectric film 6 ensures electric insulation between diaphragm 4 and electrode 3, thereby preventing short circuit between diaphragm 4 and electrode 3. In physical quantity sensor 1, from a viewpoint of increasing sensitivity of physical quantity sensor 1, a dielectric constant of dielectric film 6 is preferably high. In physical quantity sensor 1, the higher the dielectric constant of dielectric film 6 is, the more the thickness of dielectric film 6 is reduced, so that the sensitivity can be higher. In physical quantity sensor 1, the larger a difference between a capacitance when dielectric film 6 and electrode 3 are separated from each other by a predetermined distance and a capacitance when dielectric film 6 and electrode 3 contact each other is, the more the sensitivity is increased. Further, dielectric film 6 preferably has a high withstand voltage.

Dielectric film 6 is a nitride film made of nitride. More specifically, dielectric film 6 is a silicon nitride film made of silicon nitride. The silicon nitride film which is dielectric film 6 is formed by thin-film formation technology, lithography technology, and etching technology. The thin-film formation technology is Low Pressure Chemical Vapor Deposition (LPCVD). When the silicon nitride film is formed by LPCVD, material gases are, e.g. SiCl$_2$H$_2$ and NH$_3$. A composition of the silicon nitride film which is dielectric film 6 is Si$_3$N$_4$ of, e.g. a stoichiometric composition. The silicon nitride film which is dielectric film 6 has a density ranging, e.g. from 2.9 g/cm$^3$ to 3.1 g/cm$^3$. The silicon nitride film which is dielectric film 6 has a dielectric constant of, e.g. 7. The silicon nitride film which is dielectric film 6 has a hydrogen content of, e.g. equal to or smaller than 8 at %. Dielectric film 6 has a thickness ranging, e.g. from 20 nm to 200 nm. When dielectric film 6 is formed by LPCVD, an internal stress which is a tensile stress occurs in dielectric film 6. Dielectric film 6 having a thickness equal to or smaller than 200 nm prevents the internal stress from occurring in dielectric film 6.

In physical quantity sensor 1, space 8 is demarcated by wall 7 located between dielectric film 6 and electrode 3. In more detail, wall 7 is located between extraction electrode 302 of electrode 3 and a portion of dielectric film 6 that is formed in portion 402 of diaphragm 4. In physical quantity sensor 1, tip end 70 of wall 7 contacts extraction electrode 302 to seal space 8. Wall 7 has electric insulation properties.

In physical quantity sensor 1, space 8 is surrounded by substrate 2, substrate 5, diaphragm 4, and wall 7, and is filled with an inert gas to form an inert gas atmosphere. The inert gas is preferably N$_2$ gas. The inert gas is not limited to N$_2$ gas, but may be Ar gas, a mixed gas obtained by mixing N$_2$ gas and Ar gas, or inert gases other than Ar gas.

In physical quantity sensor 1, aperture 76 is formed in wall 7 and dielectric film 6. Aperture 76 passes through wall 7 and dielectric film 6 in thickness direction D1 of substrate 2 to expose a part of electrodes 3 from wall 7 and dielectric film 6 through aperture 76. Electrode pad 320 which is a part of extraction electrode 302 is exposed from wall 7 and dielectric film 6 through aperture 76. An opening of aperture 76 has a circular shape (see FIG. 1). Thus, wall 7 has a cylindrical shape. In physical quantity sensor 1, through-hole 46 passing through in thickness direction D1 of diaphragm 4 is formed in portion 402 of diaphragm 4 that faces extraction electrode 302. Through-hole 46 communicates with aperture 76. Thus, in physical quantity sensor 1, when viewed from thickness direction D1 of diaphragm 4, electrode pad 320 which is a part of electrodes 3 is exposed from surface 41 of diaphragm 4. An opening of through-hole 46 has a circular shape (see FIG. 1). For instance, a portion of diaphragm 4 in which through-hole 46 is to be formed can be etched by the inductively coupled plasma etching apparatus to form the through-hole. In physical quantity sensor 1. Aperture 76 is located inside through-hole 46 (see FIG. 1) when viewed from an opposite side of from substrate 2 with respect to diaphragm 4. This configuration of physical quantity sensor 1 prevents conductive wire 91 bonded to electrode pad 320 of electrode 3 from contacting, e.g. diaphragm 4. In other words, physical quantity sensor 1 prevents short circuit between conductive wire 91 and diaphragm 4.

Wall 7 has protrusion 71 and protrusion 72. Dielectric film 6 has surface 6b facing electrode 3 across space 8. Protrusion 71 protrudes toward electrode 3 from surface 6b of dielectric film 6. Protrusion 71 is a part of dielectric film 6. Protrusion 72 is made of nitride that protrudes toward electrode 3 from protrusion 71, and contacts electrode 3. In wall 7, at least a part of tip end 720 of protrusion 72 is located within recess 322 of electrode 3, and contacts bottom surface 323 of recess 322. Protrusion 72 is made of silicon nitride containing Si—H bonding. In short, protrusion 72 contains Si—H bonding and H—N bonding in addition to Si—N bonding. The silicon nitride film which is protrusion 72 is made of silicon nitride containing Si—H bond, and formed by thin-film formation technology, lithography technology, and etching technology. The thin-film formation technology is plasma CVD (Plasma Chemical Vapor Deposition). The silicon nitride film containing Si—H bond makes the permeability of moisture smaller than that of silicon oxide film. For instance, an analysis by a Fourier-transform-infrared-spectroscopy method can determine whether the silicon nitride film contains Si—H bond or not. In other words, criteria for determining whether the silicon nitride film contains Si—H bond or not depends on a detection limit of the analysis by a Fourier-transform-infrared-spectroscopy method. A concentration of hydrogen in protrusion 72 ranges approximately from $1 \times 10^{20}$ cm$^{-3}$ to $1 \times 10^{22}$ cm$^{-3}$, for example. For instance, the concentration of hydrogen in protrusion 72 can be determined by the analysis by using a Fourier-transform-infrared-spectroscopy method. For dielectric film 6 made of a silicon nitride film that is formed by LPCVD, a result of the analysis by a Fourier-transform-infrared-spectroscopy method shows that the content of Si—H bond is less than the detection limit.

When a silicon nitride film having Si—H bond is formed by plasma CVD, material gases are SiH$_4$ and NH$_3$. The material gases, however, are not limited to this, but may be, e.g. SiH$_4$ and N$_2$. Protrusion 72 has electric insulation properties. Protrusion 72, i.e., the silicon nitride film containing Si—H bond has a composition of SiNH, which is shifted from a stoichiometric composition of $Si_3N_4$. In other words, the composition of the silicon nitride containing Si—H is different from a composition of the silicon nitride constituting dielectric film 6. The silicon nitride film containing Si—H bond has a density ranging from 2.4 $g/cm^3$ to 2.8 $g/cm^3$, for example. The silicon nitride film containing Si—H bond has a dielectric constant of, e.g. 6. The silicon nitride film which is protrusion 72 has a hydrogen content ranging from 20 at % to 25 at %, for example. An internal stress (tensile stress) of the silicon nitride film containing Si—H bond which is formed by plasma CVD is equal to or less than one fifth of an internal stress (tensile stress) of the silicon nitride film formed by LPCVD, for example. As in the above description, in physical quantity sensor 1, protrusion 72 and dielectric film 6 are made of materials different from each other. The term of "materials different from each other" includes the case where a plurality of constituent elements all are the same and compositions thereof are different, the case where different constituent elements exist, the case where compositions are the same and additives are different, and the like.

Physical quantity sensor 1 includes protrusion 73 that protrudes toward electrode 3 from opposing surface 42 of diaphragm 4 which faces electrode 3. Protrusion 73 is covered with protrusion 71. This configuration of physical quantity sensor 1 allows dielectric film 6 integrally formed with protrusion 71 to have a larger thickness than the sensor where no protrusion 73 is provided. Thus, a thickness of protrusion 71 in thickness direction D1 of diaphragm 4, i.e., a protrusion length of protrusion 71 can be large. Protrusion 73 has a ring shape. Protrusion 73 is made of silicon oxide, and has electric insulation properties. Protrusion 73 can be formed by thermal oxidation technology, photolithographic technology, and etching technology, for example.

A method of manufacturing physical quantity sensor 1 will be described below.

In the method of manufacturing physical quantity sensor 1, first, a base wafer which becomes an origin of substrate 2 of each of plural physical quantity sensors 1, and a diaphragm wafer which becomes an origin of diaphragm 4 and substrate 5 of each of the plural physical quantity sensors 1 are prepared. The base wafer is, e.g. a glass wafer. The diaphragm wafer is, e.g. a semiconductor wafer.

In the method of manufacturing physical quantity sensor 1, the base wafer is prepared, and then, plural electrodes 3 are formed on the base wafer.

In the case where the plural electrodes 3 are formed on the base wafer, firstly, a Cr film is formed on a surface of the base wafer by sputtering. The Cr film becomes an origin of plural capacitor electrodes 301. The surface of the base wafer constitutes front surface 21 of substrate 2. Subsequently, the Cr film is patterned to form the plural capacitor electrodes 301 by photolithographic technology and etching technology. After that, an AlSi film with a predetermined thickness (e.g., 1.3 μm) which becomes an origin of plural extraction electrodes 302 is formed by sputtering so as to cover the plural capacitor electrodes 301 and portions of the surface of the base wafer exposed from the plural capacitor electrodes 301. Then, the AlSi film is patterned by photolithographic technology and etching technology to form the plural extraction electrodes 302. In this process, however, recess 322 is not formed in front surface 321 of each of the plural extraction electrodes 302.

In the method of manufacturing physical quantity sensor 1, the diaphragm wafer is prepared, and then, the following first to fourth processes are sequentially performed in this order to the diaphragm wafer.

In the first process, recess 53 is formed in a surface of the diaphragm wafer which constitutes back surface 52 of substrate 5, by photolithographic technology and etching technology.

In the second process, protrusion 73 is formed on the diaphragm wafer by thermal oxidation technology, photolithographic technology, and etching technology.

In the third process, dielectric film 6 is formed on a bottom surface of each of plural recesses 53 in the diaphragm wafer by LPCVD, photolithographic technology, and etching technology. A part of dielectric film 6 constitutes protrusion 71. In this process, however, an aperture which corresponds to aperture 76 passing through wall 7 and dielectric film 6 is not formed in protrusion 71.

In the fourth process, protrusion 72 is formed on protrusion 71 by plasma CVD, photolithographic technology, and etching technology. After that, aperture 76 which passes through dielectric film 6 and wall 7 that includes protrusion 71 and protrusion 72 is formed.

In the method of manufacturing physical quantity sensor 1, the base wafer and the diaphragm wafer are prepared. Electrode 3 is formed on the base wafer. Recess 53, protrusion 73, dielectric film 6, and wall 7 are formed in the diaphragm wafer. After that, the following fifth to ninth processes are sequentially performed in this order.

In the fifth process, wall 7 is bonded to extraction electrode 302 by anodic bonding. In the fifth process, extraction electrode 302 plastically deforms such that a part of extraction electrode 302 is crushed by wall 7. Accordingly, in the method of manufacturing physical quantity sensor 1, the fifth process forms recess 322 in front surface 321 of extraction electrode 302, and causes wall 7 to contact the entire circumference of bottom surface 323 of recess 322 simultaneously.

In the sixth process, the diaphragm wafer is locally thinned such that a portion of the diaphragm wafer corresponding to diaphragm 4 has a predetermined thickness so as to provide diaphragm 4 and substrate 5.

In the seventh process, external connection electrode 9 is formed on front surface 51 of substrate 5 by, e.g. thin-film formation technology, photolithographic technology, etching technology.

In the eighth process, through-hole 46 is formed in diaphragm 4, using photolithographic technology and etching technology. Through-hole 46 is communicated with aperture 76 that passes through wall 7 and dielectric film 6. In the method of manufacturing physical quantity sensor 1, at a step where the eighth process has been completed, a stacked wafer in which plural physical quantity sensors 1 are formed, i.e., a bonded body configured by bonding the base wafer and the diaphragm wafer can be obtained.

In the ninth process, the stacked wafer is diced to obtain the plural physical quantity sensors 1.

In the semiconductor physical quantity sensor described in International publication No. 2015/025496, moisture is likely to infiltrate into the space through the wall, thereby changing capacitance between the diaphragm and the electrode.

In physical quantity sensor 1 of the embodiment, wall 7 which demarcates space 8 includes protrusion 71 made of silicon nitride and protrusion 72 made of silicon nitride having Si—H bond. This configuration of physical quantity sensor 1 prevents moisture from infiltrating into space 8 through wall 7. Physical quantity sensor 1 prevents occurrence of cracks in wall 7 more likely than the sensor where wall 7 is made of only silicon nitride while enlarging the distance between diaphragm 4 and electrode 3. Thus, the moisture resistance of physical quantity sensor 1 is improved while the sensitivity of physical quantity sensor 1 is increased. Further, physical quantity sensor 1 improves pressure resistance between diaphragm 4 and electrode 3 compared with the sensor where wall 7 is made of only silicon nitride having Si—H bond.

The above exemplary embodiment is merely one of various kinds of exemplary embodiments in the present invention. For the above-mentioned exemplary embodiment, various modifications are possible according to a design or the like, as long as an object of the present invention is achieved.

For instance, the material of dielectric film 6 is not limited to nitride, but may be oxide, such as silicon oxide.

The nitride constituting dielectric film 6 is not limited to silicon nitride, but may be other nitride, such as HfSiON or SiON.

The nitride constituting protrusion 72 is not limited to silicon nitride containing Si—H bond, but may be other nitride, such as HfSiON containing Si—H bond or SiON containing Si—H bond.

Diaphragm 4 is not necessarily integrally formed with substrate 5, but may be formed separated from substrate 5.

Physical quantity F1 which is an object to be measured by physical quantity sensor 1 is not necessarily a pressing force, but may be other physical quantity, such as a pressure or an acceleration, that causes diaphragm 4 to warp. In short, the physical quantity sensor is not necessarily a pressing force sensor, but may be other physical quantity sensors, such as a pressure sensor and an acceleration sensor.

In electrode 3, capacitor electrode 301 and extraction electrode 302 are made of materials different from each other, but not limited to this. For instance, in physical quantity sensor 1, if dielectric film 6 contacts electrode 3, capacitor electrode 301 may be made of the same material as extraction electrode 302.

Physical quantity sensor 1 may not necessarily include protrusion 73. Protrusion 73 may be made of semiconductor material. In this case, protrusion 73 may be integrally formed with diaphragm 4.

The semiconductor wafer used for manufacturing physical quantity sensor 1 is a silicon wafer. From a viewpoint of improving the accuracy of thickness of diaphragm 4, however, an SOI (Silicon on Insulator) wafer may be employed.

As mentioned above, physical quantity sensor 1 is configured to detect physical quantity F1. Physical quantity sensor 1 in accordance with a first aspect includes substrate 2, electrode 3 provided on front surface 21 of substrate 2, diaphragm 4 formed made of semiconductor material, substrate 5 fixed to substrate 2, dielectric film 6 provided on opposing surface 42 of diaphragm 4, and wall 7 located between dielectric film 6 and electrode 3 and defines space 8. Diaphragm 4 warps in accordance with physical quantity F1. Substrate 5 supports diaphragm 4 such that diaphragm 4 has opposing surface 42 that faces electrode 3 across space 8. Dielectric film 6 has surface 6b that faces electrode 3 across space 8. Wall 7 includes protrusions 71 and 72. Protrusion 71 protrudes toward electrode 3 from surface 6b of dielectric film 6. Protrusion 72 protrudes toward electrode 3 from protrusion 71, and contacts electrode 3. Protrusion 72 is made of material different from material of dielectric film 6, and is made of nitride.

Physical quantity sensor 1 has an improved moisture resistance.

In physical quantity sensor 1 in accordance with a second aspect, the dielectric constant of dielectric film 6 is higher than the dielectric constant of protrusion 72. This configuration of physical quantity sensor 1 reduces the thickness of dielectric film 61, so that the moisture resistance can be improved.

In the first or second aspect, physical quantity sensor 1 in accordance with a third aspect further includes protrusion 73 which protrudes toward electrode 3 from opposing surface 42 of diaphragm 4 and which is covered with protrusion 71. This configuration of physical quantity sensor 1 increases the thickness of dielectric film 6 with which protrusion 71 is formed integrally compared with the sensor where protrusion 73 is not provided, so that the thickness of protrusion 71 in thickness direction D1 of diaphragm 4, i.e., the protrusion length can be large.

In physical quantity sensor 1 in accordance with a fourth aspect, dielectric film 6 is made of nitride in any one of the first to third aspects. This configuration of physical quantity sensor 1 further improves the moisture resistance.

In physical quantity sensor 1 in accordance with a fifth aspect, protrusion 72 is made of silicon nitride containing Si—H bond in any one of the first to fourth aspects. Thus, in physical quantity sensor 1, a thickness of protrusion 72 in thickness direction D1 of diaphragm 4, i.e., a protrusion length can be larger than the thickness of protrusion 71 in thickness direction D1 of diaphragm 4, i.e., the protrusion length, thereby attaining high sensitivity while improving moisture resistance.

In physical quantity sensor 1 in accordance with a sixth aspect, electrode 3 has front surface 321 that faces dielectric film 6 and has recess 322 provided therein in any one of the first to fifth aspects. At least a part of tip end 720 of protrusion 72 is located within recess 322 of electrode 3, and contacts bottom surface 323 of recess 322. This configuration of physical quantity sensor 1 improves the moisture resistance.

In physical quantity sensor 1 in accordance with a seventh aspect, aperture 76 which passes through wall 7 and dielectric film 6 such that a part of electrodes 3 is exposed from wall 7 and dielectric film 6 through aperture 76 is formed in wall 7 and dielectric film 6 in any one of the first to sixth aspects. Through-hole 46 which communicates with aperture 76 is formed in diaphragm 4. Aperture 76 is located inside through-hole 46 when viewed from an opposite side of substrate 2 with respect to diaphragm 4. Thus, in physical quantity sensor 1, conductive wire 91 which is wire-bonded to electrode 3 is prevented from contacting diaphragm 4. This configuration of physical quantity sensor 1 prevents short circuit between conductive wire 91 and diaphragm 4.

In physical quantity sensor 1 in accordance with an eighth aspect, substrate 2 is made of glass containing an alkali component in any one of the first to seventh aspects. Substrate 5 is made of silicon. Diaphragm 4 is integrally formed with substrate 5. Substrate 5 and substrate 2 are bonded directly to each other. This configuration of physical quantity sensor 1 further improves the moisture resistance.

In exemplary embodiments, the term, such as "front surface" and "back surface", indicating directions indicate relative directions determined only by a relative positional relationship between components of physical quantity sensor 1, but do not indicate absolute directions, such as a vertical direction.

What is claimed is:

1. A physical quantity sensor configured to detect physical quantity, the physical quantity sensor comprising:
   a first substrate;
   an electrode provided on the first substrate;
   a diaphragm made of semiconductor material and configured to warp in accordance with the physical quantity;

a second substrate fixed to the first substrate and supporting the diaphragm such that the diaphragm has an opposing surface facing the electrode across a space;
a dielectric film provided on the opposing surface of the diaphragm; and
a wall provided between the dielectric film and the electrode, the wall demarcating the space, wherein
the dielectric film has a surface facing the electrode across the space,
the wall includes:
a first protrusion protruding toward the electrode from the surface of the dielectric film; and
a second protrusion protruding toward the electrode from the first protrusion, the second protrusion contacting the electrode, and
the second protrusion is made of material which is nitride and which is different from material of the dielectric film.

2. The physical quantity sensor of claim 1, wherein a dielectric constant of the dielectric film is higher than a dielectric constant of the second protrusion.

3. The physical quantity sensor of claim 1, further comprising a third protrusion protruding toward the electrode from the opposing surface of the diaphragm, the third protrusion being covered with the first protrusion.

4. The physical quantity sensor of claim 1, wherein the dielectric film is made of nitride.

5. The physical quantity sensor of claim 1, wherein the second protrusion is made of silicon nitride containing Si—H bond.

6. The physical quantity sensor of claim 1, wherein
the electrode has a front surface facing the dielectric film, the front surface of the electrode having a recess provided therein, and
at least a part of a tip end of the second protrusion is located within the recess of the electrode and contacts a bottom surface of the recess.

7. The physical quantity sensor of claim 1, wherein
an aperture passing through the wall and the dielectric film is provided in the wall and the dielectric film such that a part of the electrode is exposed from the wall and the dielectric film through the aperture,
a through-hole communicating with the aperture is provided in the diaphragm, and
the aperture is located inside the through-hole when viewed from an opposite side of the first substrate with respect to the diaphragm.

8. The physical quantity sensor of claim 1, wherein
the first substrate is made of glass containing alkali component,
the second substrate is made of silicon,
the diaphragm is integrally formed with the second substrate, and
the second substrate is directly bonded to the first substrate.

9. The physical quantity sensor of claim 1, wherein the electrode is provided directly on the first substrate.

10. The physical quantity sensor of claim 1, wherein the electrode and the dielectric film are located between the first substrate and the diaphragm.

* * * * *